United States Patent
Zou et al.

(10) Patent No.: US 11,716,081 B2
(45) Date of Patent: Aug. 1, 2023

(54) CONTROLLER FOR CONTROLLING A GAN-BASED DEVICE AND METHOD FOR IMPLEMENTING THE SAME

(71) Applicant: INNOSCIENCE (SUZHOU) TECHNOLOGY CO., LTD., Suzhou (CN)

(72) Inventors: Yanbo Zou, Suzhou (CN); Fada Du, Suzhou (CN); Wenbin Xie, Suzhou (CN); Chao Tang, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 130 days.

(21) Appl. No.: 17/419,710

(22) PCT Filed: Apr. 16, 2021

(86) PCT No.: PCT/CN2021/087670
§ 371 (c)(1),
(2) Date: Jun. 29, 2021

(87) PCT Pub. No.: WO2022/217566
PCT Pub. Date: Oct. 20, 2022

(65) Prior Publication Data
US 2023/0031789 A1 Feb. 2, 2023

(51) Int. Cl.
*H03K 3/00* (2006.01)
*H03K 17/687* (2006.01)
(Continued)

(52) U.S. Cl.
CPC ........ *H03K 17/687* (2013.01); *H02M 1/0045* (2021.05); *H02M 1/08* (2013.01)

(58) Field of Classification Search
None
See application file for complete search history.

(56) References Cited

U.S. PATENT DOCUMENTS 9,601,483 B2 * 3/2017 Ikeda .................. H01L 27/0629
9,929,652 B1   3/2018 Ribarich et al.
(Continued)

FOREIGN PATENT DOCUMENTS

CN   110224688 A   9/2019
CN   212183398 U   12/2020

OTHER PUBLICATIONS

International Search Report and Written Opinion of the corresponding PCT application No. PCT/CN2021/087670 dated Jan. 14, 2022.
(Continued)

*Primary Examiner* — Kenneth B Wells
(74) *Attorney, Agent, or Firm* — McCoy Russell LLP

(57) ABSTRACT

The present disclosure provides a controller for controlling a GaN-based semiconductor device. The controller is configured to receive a current sensing signal $V_{CS}$ which is indicative of a drain-to-source current of the GaN-based semiconductor device and generate a control driving signal $V_{DRV}$ to the GaN-based semiconductor device such that a gate-to-source voltage $V_{GS}$ applied to the GaN-based semiconductor device for switching on the GaN-based semiconductor device is stabilized to a voltage value equal to a reference voltage $V_{ref}$ over an on-time duration. Impact of the change in the voltage drop across the current sensing resistor to the operation of the GaN-based semiconductor device is eliminated.

18 Claims, 9 Drawing Sheets

(51) Int. Cl.
*H02M 1/00* (2006.01)
*H02M 1/08* (2006.01)

(56) References Cited

U.S. PATENT DOCUMENTS

| | | |
|---|---|---|
| 10,367,501 B1 | 7/2019 | Ikeda |
| 2002/0159276 A1* | 10/2002 | Deboy .............. H02M 3/33507 363/20 |
| 2005/0275393 A1 | 12/2005 | Knoedgen et al. |
| 2014/0159685 A1 | 6/2014 | Ito et al. |
| 2019/0312651 A1 | 10/2019 | Li |

OTHER PUBLICATIONS

Notice of Allowance of corresponding China patent application No. 202180004428.1 dated Nov. 22, 2022.

* cited by examiner

CONTROLLER FOR CONTROLLING A GAN-BASED DEVICE AND METHOD FOR IMPLEMENTING THE SAME

TECHNICAL FIELD

The subject application generally relates to a controller, and more particularly relates to a controller for controlling a gallium nitride (GaN)-based semiconductor device.

BACKGROUND

GaN-based semiconductor devices have been widely used for high frequency electrical energy conversion systems because of low power losses and fast switching transition. In comparison with silicon (Si) Metal Oxide Semiconductor Field Effect Transistor (MOSFET), GaN High-Electron-Mobility Transistor (HEMT) has a much better figure of merit and more promising performance for high-power, high-frequency application. When using a controller to control a Si MOSFET, a sampling resistor is connected in series with the MOSFET for sensing a drain current flowing though the MOSFET. However, such approach may cause a problem in driving a GaN-based HEMT because of its lower threshold voltage (typically around 6V). The driving voltage for switching on the GaN-based device will be significantly reduced due to the voltage drop across the sampling resistor and therefore stability problems are caused.

SUMMARY

One object of the subject application is to provide a controller which is capable to providing a stable driving voltage for controlling a GaN-based device irrespective of the current flowing through a current sensing resistor coupled with the GaN-based device.

According to one aspect of the subject application, there is provided a controller for controlling a GaN-based semiconductor device. The controller comprises: a CS node configured for electrically connecting to a source terminal of the GaN-based semiconductor device and receiving a current sensing signal $V_{CS}$ which is indicative of a drain-to-source current of the GaN-based semiconductor device when the source terminal of the GaN-based semiconductor device is connected to a ground through a current sensing resistor. The controller further comprises a low dropout regulator configured to generate a reference voltage $V_{ref}$; a step-up converter connected to the CS node and configured to convert the reference voltage $V_{ref}$ to a step-up voltage $V_{DD}$ which is given by $V_{DD}=V_{ref}+V_{CS}$; and a driver configured to receive the step-up voltage $V_{DD}$ from the step-up converter as an internal power supply voltage; and receive a current sensing signal $V_{CS}$ from the CS node as an internal ground; and provide a control driving signal $V_{DRV}$ to the semiconductor device such that a gate-to-source voltage $V_{GS}$ applied to the GaN-based semiconductor device for switching on the GaN-based semiconductor device is stabilized or fixed to a voltage value equal to the reference voltage $V_{ref}$ over an on-time duration.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

In the following description, embodiments of a controller for controlling a GaN-based semiconductor device are set forth as preferred examples in accordance with the subject application. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Reference in this specification to "one embodiment" or "an embodiment" means that a particular feature, structure, or characteristic described in connection with the embodiment is included in at least one of the embodiments of the invention. The appearances of the phrase "in one embodiment" or "in some embodiments" in various places in the specifications are not necessarily all referring to the same embodiments, nor are separate or alternative embodiments mutually exclusive of other embodiments. Moreover, various features are described which may be exhibited by some embodiments and not by others.

Figure 1:
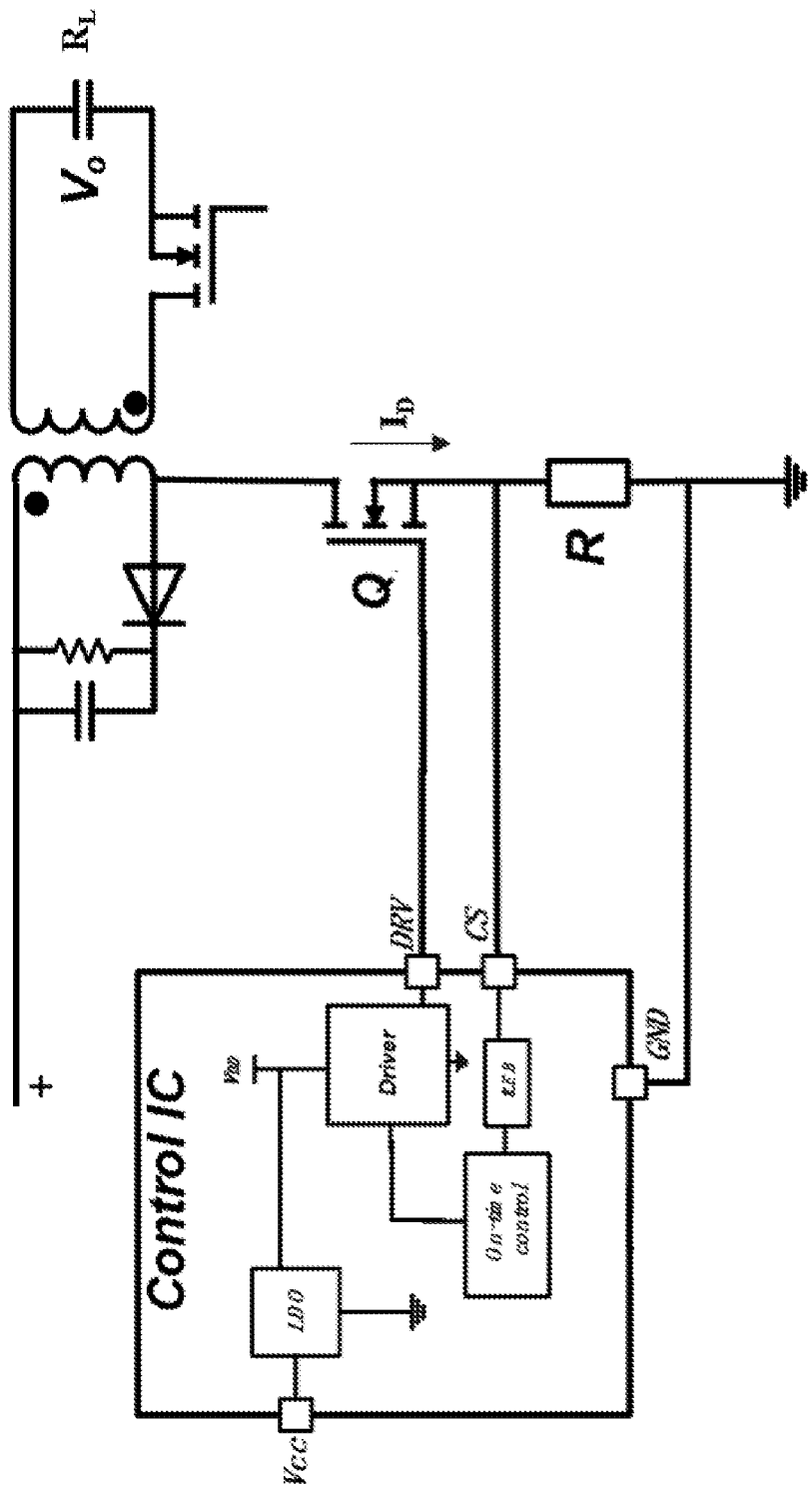
FIG. 1 depicts a circuit diagram showing how a GaN-based device is controlled by a controller according to the prior art.

FIG. 1 depicts a circuit diagram showing how a GaN-based semiconductor device is controlled by a controller according to a comparative embodiment of the present invention.

Referring to FIG. 1, the controller may have a driving output (DRV) node coupled with a GaN-based semiconductor device Q and be configured to generate a driving signal $V_{DRV}$ to apply a gate-to-source voltage $V_{GS}$ to the GaN-based semiconductor device for switching ON/OFF the GaN-based semiconductor device Q. A current sensing resistor R may be coupled to the GaN-based semiconductor device Q for sensing a drain current $I_D$ flowing through the GaN-based semiconductor device Q. The controller may have a current sensing (CS) node coupled with the current sensing resistor R to sense a current sensing voltage Vcs across the current sensing resistor R. The current sensing voltage Vcs is given by $Vcs=I_D*R$. The gate-to-source voltage $V_{GS}$ applied on the GaN-based semiconductor device depends on the potential difference between the control driving signal $V_{DRV}$ and the current sensing voltage Vcs and is given by $V_{GS}=V_{DRV}-V_{CS}$. Therefore, the gate-to-source voltage $V_{GS}$ has a relationship with the drain current $I_D$ and is given by $V_{GS}=V_{DRV}-I_D*R$.

Figure 2:
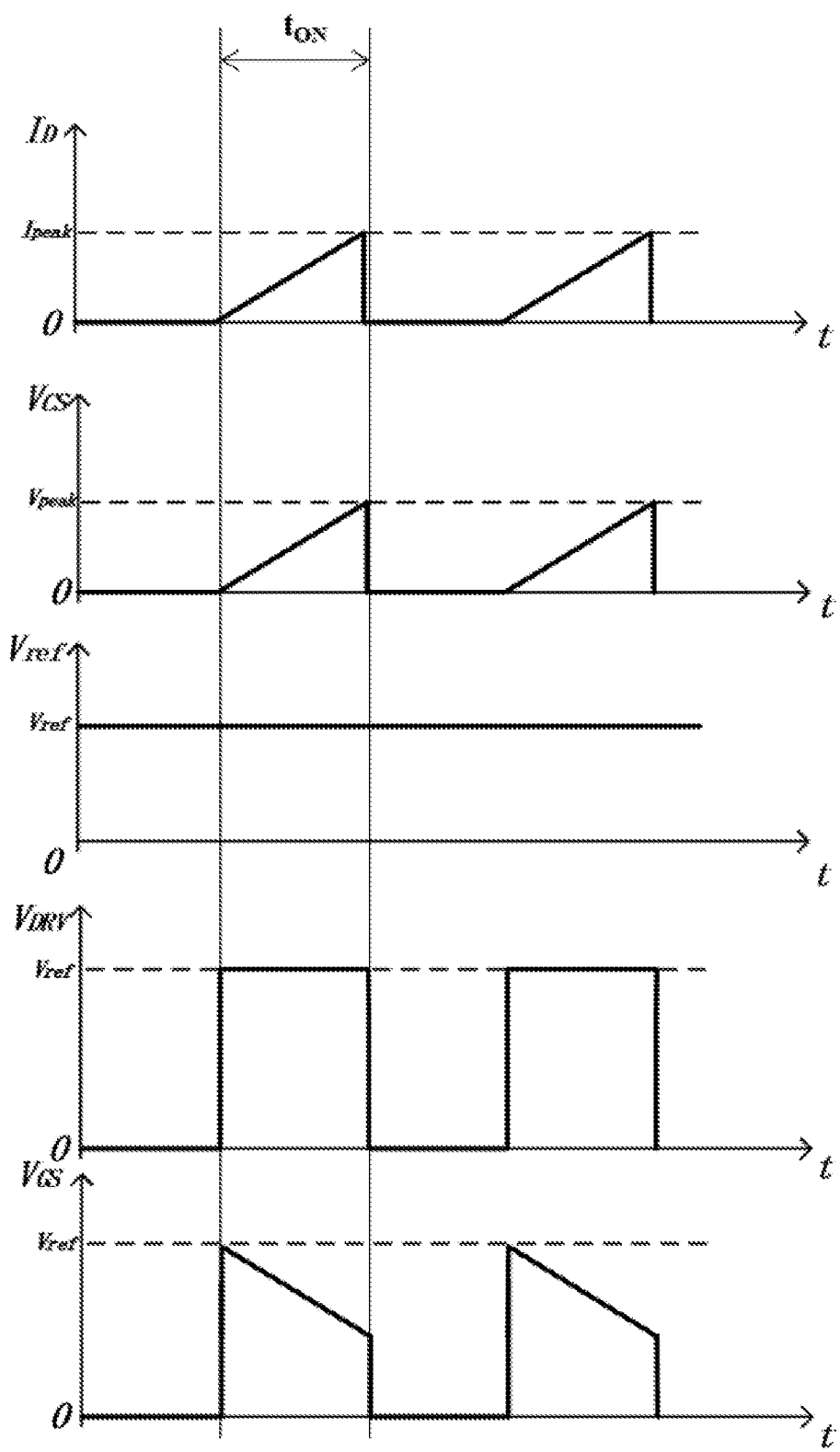
FIG. 2 depicts various signal waveforms of the controller of FIG. 1.

Referring to FIG. 2, in a on-time duration $t_{ON}$, the control driving signal $V_{DRV}$ is set to be equal to a high-voltage level, such as a reference voltage Vref, to turn on the GaN-based semiconductor device. As the GaN-based semiconductor device is turned on, the drain current $I_D$ flowing through the GaN-based semiconductor device Q increases, which in turn causes the gate-to-source voltage $V_{GS}$ to decrease due to the relationship $V_{GS}=V_{DRV}-I_D*R$. If the gate-to-source voltage $V_{GS}$ is caused to decrease to a voltage level that is lower than the threshold voltage Vth of the GaN-based semiconductor device, the GaN-based semiconductor device will be turned off unexpectedly even though the control driving signal $V_{DRV}$ is still being set to a high-voltage level.

Figure 3:
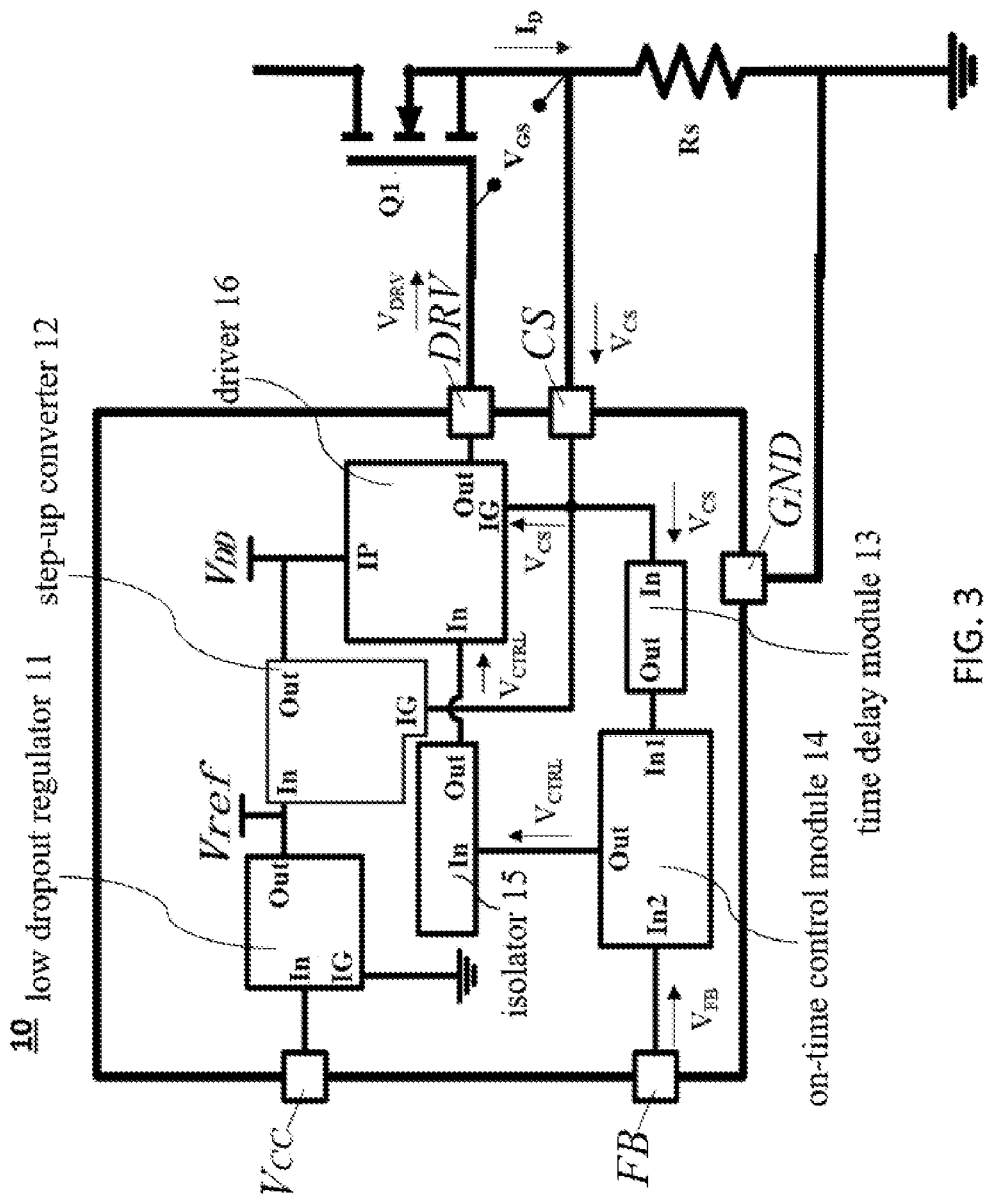
FIG. 3 depicts a circuit block diagram of a controller for controlling a GaN-based device according to an embodiment of the present invention.

FIG. 3 depicts a circuit block diagram of a controller 10 for controlling a GaN-based semiconductor device for power conversion according to an embodiment of the present invention. For simplicity, terminals having the same functionality, such as input terminals, output terminals, reference terminals, internal ground terminals from different modules will be denoted inside the relevant blocks with the same labels, such as "In", "Out", "Ref" and "IG".

Referring to FIG. 3, the controller 10 may comprise a VCC node configured for electrically connecting to a DC power supply (not shown). The controller 10 may comprise a GND node configured for electrically connecting to a ground GND. The controller 10 may comprise a DRV node configured for electrically connecting to a gate terminal of a GaN-based semiconductor device Q1 and transmitting a control driving signal $V_{DRV}$ for switching on and off the GaN-based semiconductor device.

The controller 10 may comprise a CS node configured for electrically connecting to a source terminal of the GaN-based semiconductor device and receiving a current sensing signal $V_{CS}$ which is indicative of a drain current $I_D$ of the GaN-based semiconductor device when the source terminal of the GaN-based semiconductor device is connected to the ground through a current sensing resistor Rs, wherein the current sensing signal Vcs is a voltage across the current sensing resistor R and given by $Vcs=I_D*Rs$.

The controller 10 may comprise a FB node configured for electrically connecting to a feedback circuit for sensing a feedback signal $V_{FB}$ which is indicative of an output current flowing through a load (not shown).

The controller 10 may further comprise a low dropout regulator 11. The low dropout regulator 11 may have an input (In) terminal, an output (Out) terminal and an internal ground (IG) terminal. The input terminal of the low dropout regulator 11 may be connected to the VCC node. The internal ground terminal of the low dropout regulator 11 may be connected to the GND node.

The controller 10 may further comprise a step-up converter 12. The step-up converter 12 may have an input (In) terminal, an output (Out) terminal and an internal ground (IG) terminal. The input terminal of the step-up converter 12 may be connected to the output terminal of the low dropout regulator 11. The internal ground terminal of the step-up converter 12 may be connected to the CS node.

The controller 10 may further comprise a time delay module 13. The time delay module 13 may have an input (In) terminal and an output (Out) terminal. The input terminal of the time delay module 13 may be connected to the CS node.

The controller 10 may further comprise an on-time control module 14. The on-time control module 14 may have a first input terminal (In1), a second input terminal (In2) and an output (Out) terminal. The first input terminal of the on-time control module 14 may be connected to the output terminal of the time delay module 13. The second input terminal of the on-time control module 14 may be connected to the FB node.

The controller 10 may further comprise an isolator 15. The isolator 15 may have an input (In) terminal and an output (Out) terminal. The input terminal of the isolator 15 may be connected to the output terminal of the on-time control module 14.

The controller 10 may further comprise a driver 16. The driver 16 may have an input (In) terminal, an output (Out) terminal, an internal power terminal (IP) and an internal ground (IG) terminal. The internal power terminal of the driver 16 may be connected to the output terminal of the step-up converter 12. The internal power terminal of the driver 16 may be connected to the output terminal of the step-up converter 12. The internal ground terminal of the driver 16 may be connected to the CS node. The output terminal of the driver 16 may be connected to the DRV node.

Figure 4:
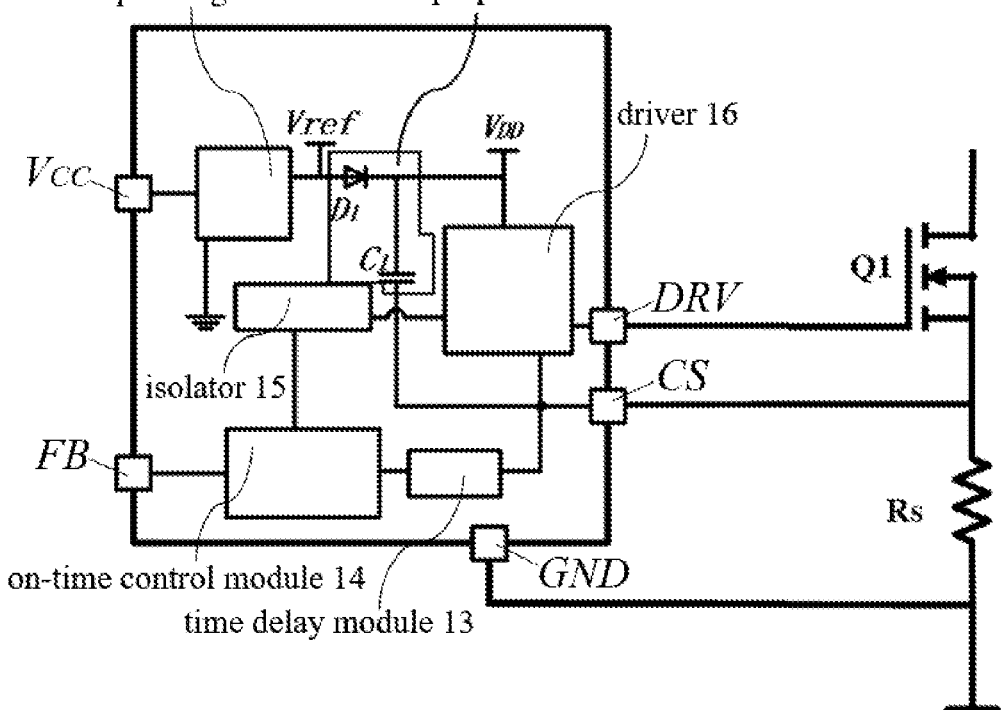
FIG. 4 depicts a more detailed circuit diagram of the controller of FIG. 3 configured with an exemplary step-up converter.

Referring to FIG. 4, in some embodiments, the step-up converter 12 may comprise a diode D1 and a capacitor C1. The diode D1 may have a positive terminal connected to the output terminal of the low dropout regulator 11 and a negative terminal connected to the internal power terminal of the driver 16. The capacitor C1 may have a first terminal connected to a negative terminal of the diode D1 and a second terminal connected to the CS node.

Figure 5:
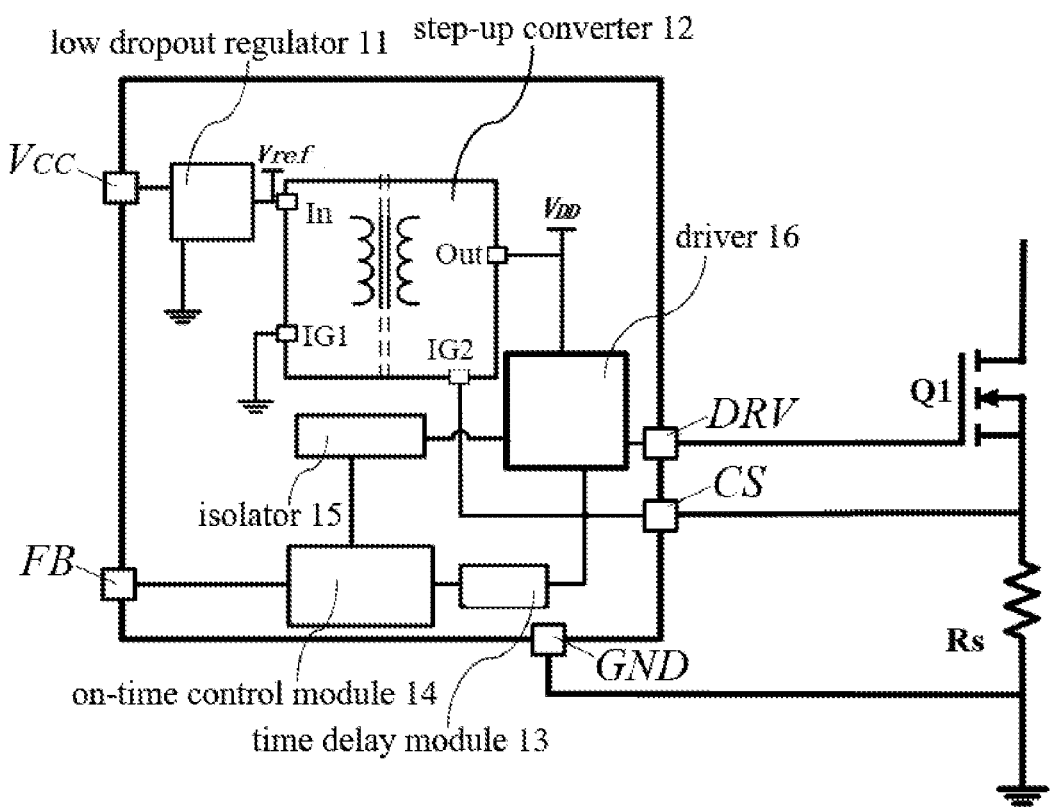
FIG. 5 depicts a more detailed circuit diagram of the controller of FIG. 3 configured with another exemplary step-up converter.

Referring to FIG. 5, in some embodiments, the step-up converter 12 may comprise a half-bridge DC/DC module. The half-bridge DC/DC module may have an input (In) terminal, an output (Out) terminal, a first internal ground (IG1) terminal and a second internal ground (IG2) terminal. The input terminal of the half-bridge DC/DC module may be connected to the output terminal of the low dropout regulator 11. The output terminal of the half-bridge DC/DC module may be connected to the internal power terminal of the driver 16. The first internal ground terminal may be connected to the GND node. The second internal ground terminal may be connected to the CS node.

Figure 6:
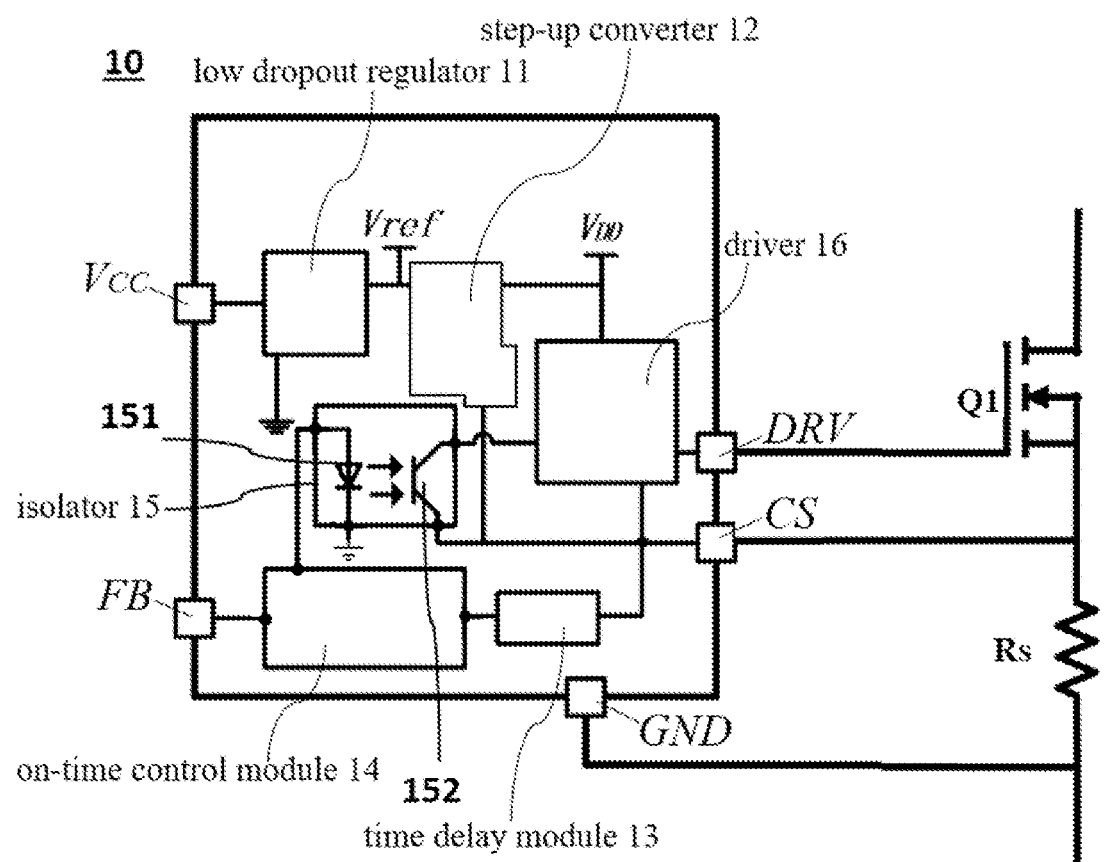
FIG. 6 depicts a more detailed circuit diagram of the controller of FIG. 3 configured with an exemplary isolator.

Referring to FIG. 6, in some embodiments, the isolator 15 may be an optical isolator comprising a light emitting diode 151 and a photo diode 152.

The light emitting diode 151 may have a positive terminal and a negative terminal. The positive terminal of the light emitting diode 151 may be connected to the output terminal of the on-time control module 14. The negative terminal of the light emitting diode 151 may be connected to the GND node.

The photo diode 152 may have a negative terminal and a positive terminal. The negative terminal of the photo diode 152 may be connected to the input terminal of the driver 16. The positive terminal of the photo diode 152 may be connected to the CS node.

Figure 7:
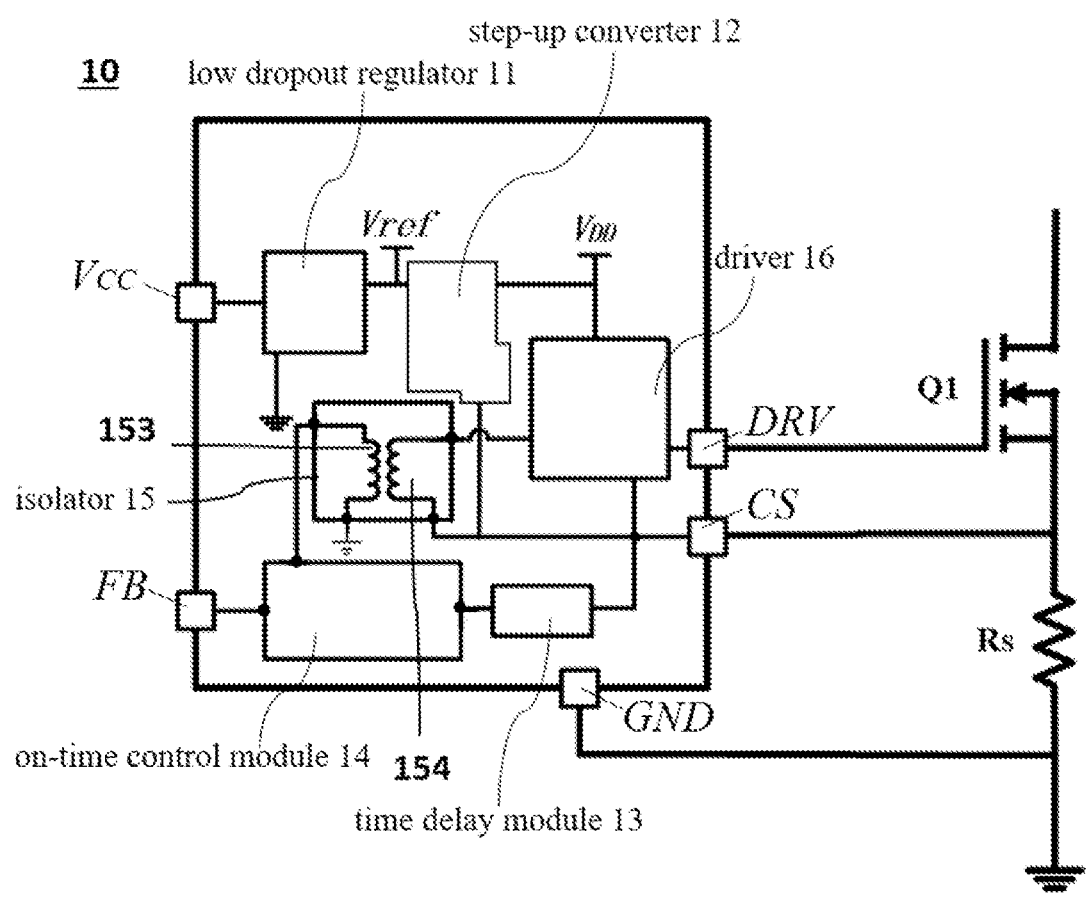
FIG. 7 depicts a more detailed circuit diagram of the controller of FIG. 3 configured with another exemplary isolator.

Referring to FIG. 7, in some embodiments, the isolator 15 may be a magnetic isolator comprising a primary winding 153 and a secondary winding 154.

The primary winding 153 may have a first terminal and a second terminal. The first terminal of the primary winding 153 may be connected to the output terminal of the on-time control module 14. The second terminal of the primary winding 153 may be connected to the GND node.

The secondary winding 154 may have a first terminal and a second terminal. The first terminal of the secondary winding 154 may be connected to the input terminal of the driver 16. The second terminal of the secondary winding 154 may be connected to the CS node.

Referring back to FIG. 3, the low drop regulator may be configured to generate a reference voltage Vref at its output terminal based on a DC power supply connected to the VCC node.

The step-up converter 12 may be configured to receive the reference voltage $V_{ref}$ from the low dropout regulator 11 and convert the reference voltage $V_{ref}$ to a step-up voltage $V_{DD}$ which is given by $V_{DD}=V_{ref}+V_{CS}$; and provide the step-up voltage $V_{DD}$ at its output terminal.

The time delay module 13 may be configured to apply a time delay $t_{DL}$ to the current sensing signal voltage $V_{CS}$.

The on-time control module 14 may be configured to: receive the delayed current sensing signal voltage $V_{CS}$ from the time delay module 13; receive the feedback signal $V_{FB}$ from the FB node; and provide an on-time control signal $V_{CRTL}$ at its output terminal based on the received feedback signal $V_{FB}$ and the delayed current sensing signal voltage $V_{CS}$.

The isolator 15 may be configured to couple the on-time control signal $V_{CRTL}$ from the on-time control module 14 to the driver 16.

The driver 16 may be configured to: receive the step-up voltage $V_{DD}$ from the step-up converter 12 as an internal power supply voltage; receive the current sensing signal voltage $V_{CS}$ from the CS node as an internal ground; receive the on-time control signal $V_{CRTL}$ from the isolator 15; and provide the control driving signal $V_{DRV}$ to the gate terminal of the GaN-based semiconductor device such that a gate-to-source voltage $V_{GS}$ applied to the GaN-based semiconductor device for switching on the GaN-based semiconductor device is stabilized or fixed to a voltage value equal to the reference voltage $V_{ref}$.

Figure 8:
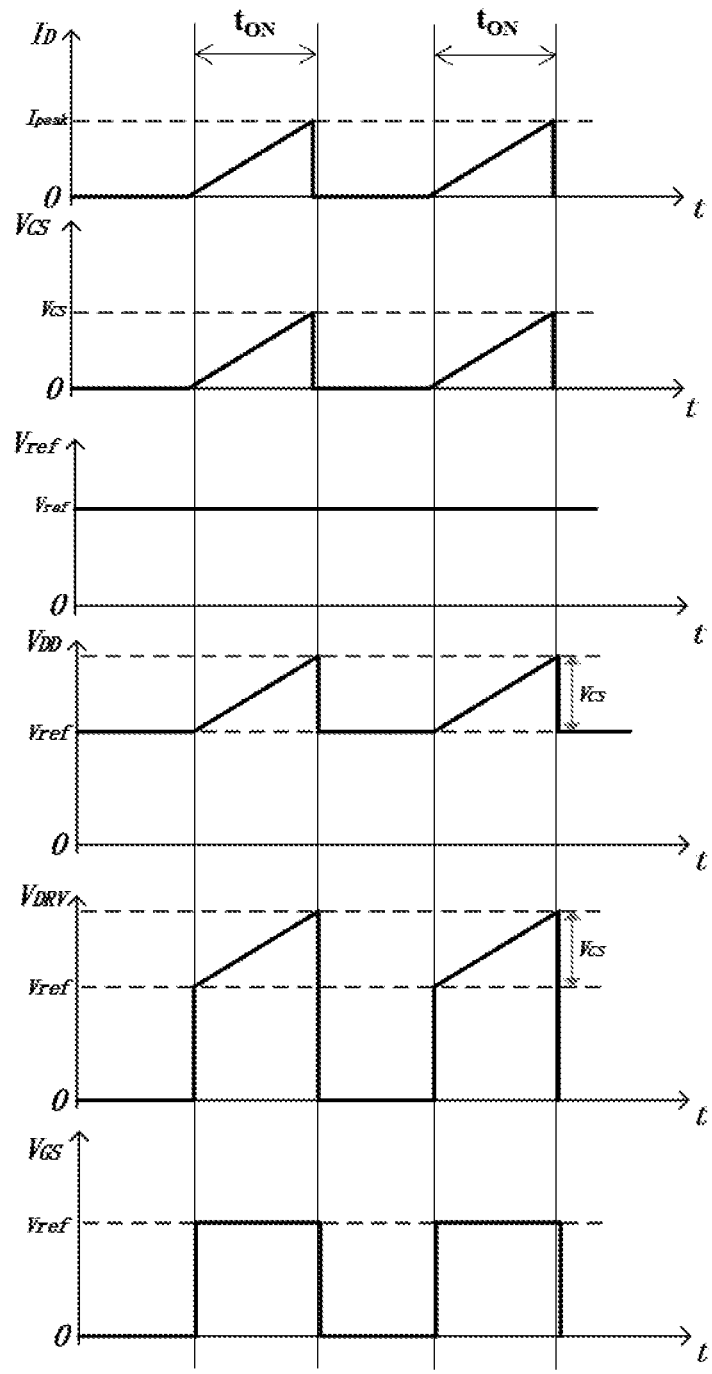
FIG. 8 depicts various signal waveforms of the controller of FIG. 3.

FIG. 8 depicts a timing diagram showing how the gate-to-source voltage $V_{GS}$ for switching on the GaN-based semiconductor device is regulated to a voltage value equal to the reference voltage $V_{ref}$. Referring to FIG. 8. In an on-time duration $t_{ON}$, although the currenting sensing voltage VCS increases as the drain current $I_D$ increases, as given by the relationship VCS=$I_D$*Rs, the gate-to-source voltage $V_{GS}$, which is the actual driving voltage of the GaN-based semiconductor device, can be stabilized or fixed to reference voltage $V_{ref}$. This is because the step-up converter 12 uses the current sensing voltage $V_{CS}$ as an internal ground and converts the reference voltage $V_{ref}$ to a step-up voltage $V_{DD}$ which is given by $V_{DD}=V_{ref}+V_{CS}$. The step-up voltage $V_{DD}$ is then used by the driver 16 as its internal power to generate a stepped-up control driving signal $V_{DRV}$ which is given by $V_{DRV}=V_{ref}+V_{CS}$. The gate-to-source voltage $V_{GS}$, which is the voltage difference between the control driving signal $V_{DRV}$ and the Voltage Across the Current sensing resistor Rs, is then given by $V_{GS}=V_{DRV}-V_{CS}=(V_{ref}+V_{CS})-V_{CS}=V_{ref}$ over the on-time duration torr. As a result, the impact of the change in the voltage drop across the current sensing resistor Rs on the operation of the GaN-based semiconductor device can be eliminated and the GaN-based semiconductor device can be fully switched on and operate in its saturation region over the on-time duration $t_{ON}$.

Figure 9:
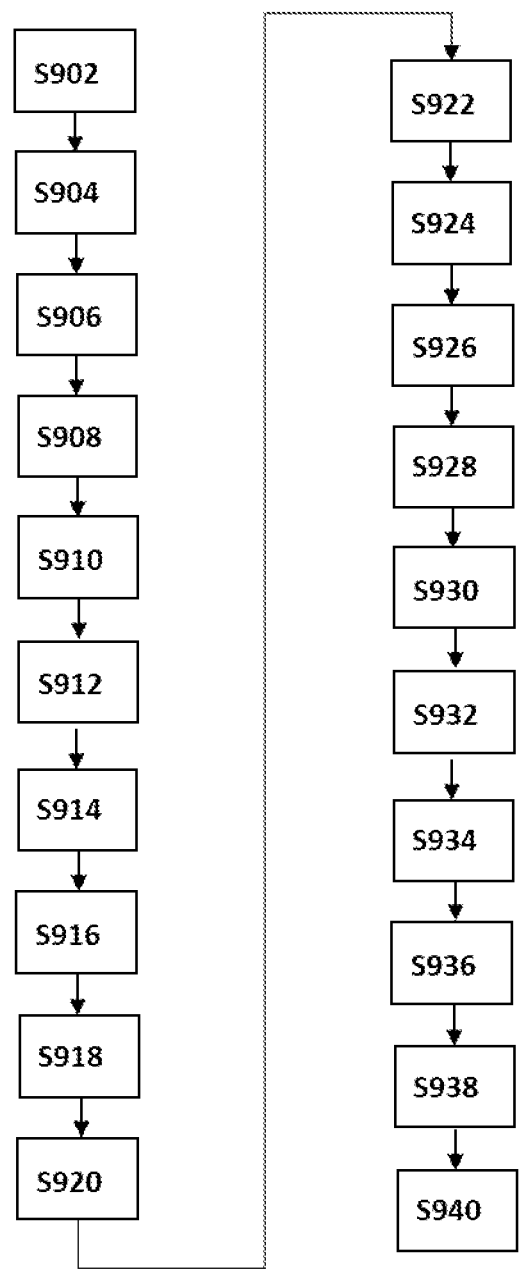
FIG. 9 depicts a flowchart of a method for implementing a controller for controlling a GaN-based device according to an embodiment of the present invention.

FIG. 9 depicts a flowchart of a method for implementing a controller for controlling a GaN-based semiconductor device for power conversion. Referring to FIG. 9. The method may comprise the following steps:

S902: configuring a VCC node in the controller for electrically connecting to a DC power supply;

S904: configuring a GND node in the controller for electrically connecting to a ground GND;

S906: configuring a DRV node in the controller for electrically connecting to a gate terminal of a GaN-based semiconductor device and transmitting a control driving signal $V_{DRV}$ for switching on and off the GaN-based semiconductor device;

S908: configuring a CS node in the controller for electrically connecting to a source terminal of the GaN-based semiconductor device and receiving a current sensing signal $V_{CS}$ which is indicative of a drain-to-source current of the GaN-based semiconductor device when the source terminal of the GaN-based semiconductor device is connected to the ground through a current sensing resistor (Rs);

S910: configuring a FB node in the controller for electrically connecting to a feedback circuit for sensing a feedback signal $V_{FB}$ which is indicative of an output current flowing through a load;

S912: implementing a low dropout regulator 11, connecting an input terminal of the low dropout regulator to the VCC node, connecting a ground terminal of the low dropout regulator to the GND node;

S914: implementing a step-up converter, connecting an input terminal of the step-up converter to an output terminal of the low dropout regulator, connecting a ground terminal of the step-up converter to the CS node;

S916: implementing a driver, connecting a power terminal of the driver to an output terminal of the step-up converter, connecting a ground terminal of the driver to the CS node, and connecting an output terminal of the driver to the DRV node;

S918: configuring the low dropout regulator to generate a reference voltage $V_{ref}$ based on the DC power supply;

S920: configuring the step-up converter to convert the reference voltage $V_{ref}$ to a step-up voltage $V_{DD}$ which is given by $V_{DD}=V_{ref}+V_{CS}$;

S922: configuring the driver to: receive the step-up voltage $V_{DD}$ from the step-up converter as an internal power supply voltage; receive the current sensing signal voltage $V_{CS}$ from the CS node as an internal ground;

S924: generate the control driving signal $V_{DRV}$ such that a gate-to-source voltage $V_{GS}$ applied to the GaN-based semiconductor device for switching on the GaN-based semiconductor device is stabilized or fixed to a voltage value equal to the reference voltage $V_{ref}$.

S926: implementing a time delay module, connecting an input terminal of the time delay module to the CS node;

S928: implementing an on-time control module, connecting a first input terminal of the on-time control module to an output terminal of the time delay module, connecting a second input terminal of the on-time control module to the FB node;

S930: implementing an isolator, connecting an input terminal of the isolator to an output terminal of the on-time control module;

S932: connecting an input terminal of the driver to an output terminal of the isolator;

S934: configuring the time delay module to apply a time delay $t_{DL}$ to the current sensing signal voltage $V_{CS}$;

S936: configuring the on-time control module to: receive the delayed current sensing signal voltage $V_{CS}$ from the time delay module; receive the feedback signal $V_{FB}$ from the FB node; and generate an on-time control signal $V_{CRTL}$ based on the received feedback signal $V_{FB}$ and the delayed current sensing signal voltage $V_{CS}$;

S938: configuring the isolator to couple the on-time control signal $V_{CRTL}$ from the on-time control module to the driver;

S940: configuring the driver to: receive the on-time control signal $V_{CRTL}$ from the isolator; and generate the control driving signal $V_{DRV}$ based on the received on-time control signal $V_{CRTL}$.

In some embodiments, the implementation of the step-up converter may comprise: providing a diode D1, connecting a positive terminal of the diode D1 connected to the output terminal of the low dropout regulator, connecting a negative terminal of the diode D1 to the internal power terminal of the driver; and providing a capacitor C1, connecting a first terminal of the capacitor C1 to a negative terminal of the diode D1, connecting a second terminal of the capacitor C1 to the CS node of the controller.

In some embodiments, the implementation of the step-up converter may comprise providing a half-bridge DC/DC module, connecting an input terminal of the half-bridge DC/DC module to the output terminal of the low dropout regulator, connecting an output terminal of the half-bridge DC/DC module to the power terminal of the driver, connecting a first internal ground terminal being to the GND node, and connecting a second internal ground terminal to the CS node.

In some embodiments, the implementation of the isolator may comprise: providing an optical isolator including a light emitting diode and a photo diode; connecting a positive terminal of the light emitting diode to the output terminal of the on-time control module, connecting a negative terminal of the light emitting diode to the GND node; and connecting a negative terminal of the photo diode to the input terminal of the driver, connecting a positive terminal of the photo diode to the CS node.

In some embodiments, the implementation of the isolator may comprise: providing a magnetic isolator including a primary winding and a secondary winding; connecting a first terminal of the primary winding to the output terminal of the on-time control module, connecting a second terminal of the primary winding to the GND node; and connecting a first terminal of the secondary winding to the input terminal of the driver, connecting a second terminal of the secondary winding to the CS node.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations

The invention claimed is:

1. A controller for controlling a GaN-based semiconductor device, comprising:
   a VCC node configured for electrically connecting to a DC power supply;
   a GND node configured for electrically connecting to a ground;
   a DRV node configured for electrically connecting to a gate terminal of the GaN-based semiconductor device and transmitting a control driving signal $V_{DRV}$ for switching on and off the GaN-based semiconductor device;
   a CS node configured for electrically connecting to a source terminal of the GaN-based semiconductor device and receiving a current sensing signal $V_{CS}$ which is indicative of a drain-to-source current of the GaN-based semiconductor device when the source terminal of the GaN-based semiconductor device is connected to the ground through a current sensing resistor;
   a low dropout regulator having an input terminal connected to the VCC node and an internal ground terminal connected to the GND node;
   a step-up converter having an input terminal connected to an output terminal of the low dropout regulator and an internal ground terminal connected to the CS node; and
   a driver having an internal power terminal connected to an output terminal of the step-up converter, an internal ground terminal connected to the CS node and an output terminal connected to the DRV node; and
   wherein the low drop regulator is configured to generate a reference voltage $V_{ref}$ based on the DC power supply;
   wherein the step-up converter is configured to convert the reference voltage $V_{ref}$ to a step-up voltage $V_{DD}$ which is given by $V_{DD}=V_{ref}+V_{CS}$;
   wherein the driver is configured to:
      receive the step-up voltage $V_{DD}$ from the step-up converter as an internal power supply voltage;
      receive the current sensing signal $V_{CS}$ from the CS node as an internal ground; and
      generate the control driving signal $V_{DRV}$ such that a gate-to-source voltage $V_{GS}$ applied to the GaN-based semiconductor device for switching on the GaN-based semiconductor device is stabilized to a voltage value equal to the reference voltage $V_{ref}$ over an on-time duration.

2. The controller according to claim 1, wherein the step-up converter comprises:
   a first diode having a positive terminal connected to the output terminal of the low-drop regulator and a negative terminal connected to the internal power terminal of the driver; and
   a first capacitor having a first terminal connected to a negative terminal of the first diode and a second terminal connected to the CS node of the controller.

3. The controller according to claim 1, wherein the step-up converter comprises a half-bridge DC/DC module having an input terminal, an output terminal, a first internal ground terminal and a second internal ground terminal;
   wherein the input terminal of the half-bridge DC/DC module being connected to the output terminal of the low-drop regulator;
   wherein the output terminal of the half-bridge DC/DC module being connected to the internal power terminal of the driver;
   wherein the first internal ground terminal being connected to the GND node; and wherein the second internal ground terminal being connected to the CS node.

4. The controller according to claim 2, further comprising:
a FB node configured for electrically connecting to a feedback circuit for sensing a feedback signal $V_{FB}$ which is indicative of an output current flowing through a load;
a time delay module having an input terminal and an output terminal, the input terminal of the time delay module being connected to the CS node;
an on-time control module having a first input terminal, a second input terminal and an output terminal, the first input terminal of the on-time control module being connected to the output terminal of the time delay module, the second input terminal of the on-time control module being connected to the FB node; and
an isolator having an input terminal and an output terminal, the input terminal of the isolator being connected to the output terminal of the on-time control module; and
wherein the input terminal of the driver is connected to the output terminal of the isolator;
wherein the time delay module is configured to apply a time delay to the current sensing signal voltage $V_{CS}$;
wherein the on-time control module is configured to:
receive the delayed current sensing signal voltage $V_{CS}$ from the time delay module;
receive the feedback signal $V_{FB}$ from the FB node; and
generate an on-time control signal $V_{CRTL}$ based on the received feedback signal $V_{FB}$ and the delayed current sensing signal voltage $V_{CS}$;
wherein the isolator is configured to couple the on-time control signal $V_{CRTL}$ from the on-time control module to the driver; and
wherein the driver is further configured to:
receive the on-time control signal $V_{CRTL}$ from the isolator; and
generate the control driving signal $V_{DRV}$ based on the received on-time control signal $V_{CRTL}$.

5. The controller according to claim 4, wherein the isolator is an optical isolator comprising:
a light emitting diode having a positive terminal and a negative terminal, the positive terminal of the light emitting diode being connected to the output terminal of the on-time control module, the negative terminal of the light emitting diode being connected to the GND node; and
a photo diode having a negative terminal and a positive terminal, the negative terminal of the photo diode being connected to the input terminal of the driver, the positive terminal of the photo diode being connected to the CS node.

6. The controller according to claim 4, wherein the isolator is a magnetic isolator comprising:
a primary winding having a first terminal and a second terminal, the first terminal of the primary winding being connected to the output terminal of the on-time control module, the second terminal of the primary winding being connected to the GND node; and
a secondary winding having a first terminal and a second terminal, the first terminal of the secondary winding being connected to the input terminal of the driver, the second terminal of the secondary winding being connected to the CS node.

7. The controller according to claim 3, further comprising:
a FB node configured for electrically connecting to a feedback circuit for sensing a feedback signal $V_{FB}$ which is indicative of an output current flowing through a load;
a time delay module having an input terminal and an output terminal, the input terminal of the time delay module being connected to the CS node;
an on-time control module having a first input terminal, a second input terminal and an output terminal, the first input terminal of the on-time control module being connected to the output terminal of the time delay module, the second input terminal of the on-time control module being connected to the FB node; and
an isolator having an input terminal and an output terminal, the input terminal of the isolator being connected to the output terminal of the on-time control module; and
wherein the input terminal of the driver is connected to the output terminal of the isolator;
wherein the time delay module is configured to apply a time delay to the current sensing signal voltage $V_{CS}$;
wherein the on-time control module is configured to:
receive the delayed current sensing signal voltage $V_{CS}$ from the time delay module;
receive the feedback signal $V_{FB}$ from the FB node; and
generate an on-time control signal $V_{CRTL}$ based on the received feedback signal $V_{FB}$ and the delayed current sensing signal voltage $V_{CS}$;
wherein the isolator is configured to couple the on-time control signal $V_{CRTL}$ from the on-time control module to the driver; and
wherein the driver is further configured to:
receive the on-time control signal $V_{CRTL}$ from the isolator; and
generate the control driving signal $V_{DRV}$ based on the received on-time control signal $V_{CRTL}$.

8. The controller according to claim 7, wherein the isolator is an optical isolator comprising:
a light emitting diode having a positive terminal and a negative terminal, the positive terminal of the light emitting diode being connected to the output terminal of the on-time control module, the negative terminal of the light emitting diode being connected to the GND node; and
a photo diode having a negative terminal and a positive terminal, the negative terminal of the photo diode being connected to the input terminal of the driver, the positive terminal of the photo diode being connected to the CS node.

9. The controller according to claim 7, wherein the isolator is a magnetic isolator comprising:
a primary winding having a first terminal and a second terminal, the first terminal of the primary winding being connected to the output terminal of the on-time control module, the second terminal of the primary winding being connected to the GND node; and
a secondary winding having a first terminal and a second terminal, the first terminal of the secondary winding being connected to the input terminal of the driver, the second terminal of the secondary winding being connected to the CS node.

10. A method for implementing a controller for controlling a GaN-based semiconductor device, comprising:
configuring a VCC node in the controller for electrically connecting to a DC power supply;

configuring a GND node in the controller for electrically connecting to a ground GND;

configuring a DRV node in the controller for electrically connecting to a gate terminal of the GaN-based semiconductor device and transmitting a control driving signal $V_{DRV}$ for switching on and off the GaN-based semiconductor device;

configuring a CS node in the controller for electrically connecting to a source terminal of the GaN-based semiconductor device and receiving a current sensing signal $V_{CS}$ which is indicative of a drain-to-source current of the GaN-based semiconductor device when the source terminal of the GaN-based semiconductor device is connected to the ground through a current sensing resistor;

implementing a low dropout regulator, connecting an input terminal of the low dropout regulator to the VCC node, connecting an internal ground terminal of the low dropout regulator to the GND node;

implementing a step-up converter, connecting an input terminal of the step-up converter to an output terminal of the low dropout regulator, connecting an internal ground terminal of the step-up converter to the CS node;

implementing a driver, connecting an internal power terminal of the driver to an output terminal of the step-up converter, connecting an internal ground terminal of the driver to the CS node, and connecting an output terminal of the driver to the DRV node;

configuring the low dropout regulator to generate a reference voltage Vref based on the DC power supply;

configuring the step-up converter to convert the reference voltage $V_{ref}$ to a step-up voltage $V_{DD}$ which is given by $V_{DD}=V_{ref}+V_{CS}$;

configuring the driver to:
  receive the step-up voltage $V_{DD}$ from the step-up converter as an internal power supply voltage;
  receive the current sensing signal $V_{CS}$ from the CS node; and
  generate the control driving signal $V_{DRV}$ such that a gate-to-source voltage $V_{GS}$ applied to the GaN-based semiconductor device for switching on the GaN-based semiconductor device is stabilized to a voltage value equal to the reference voltage $V_{ref}$ over an on-time duration.

11. The method according to any one of claim 10, wherein the implementation of the step-up converter comprises:
  providing a first diode, connecting a positive terminal of the first diode to the output terminal of the low dropout regulator, connecting a negative terminal of the first diode to the internal power terminal of the driver; and
  providing a first capacitor, connecting a first terminal of the first capacitor to a negative terminal of the first diode, connecting a second terminal of the first capacitor to the CS node of the controller.

12. The method according to any one of claim 10, wherein the implementation of the step-up converter comprises:
  providing a half-bridge DC/DC module;
  connecting an input terminal of the half-bridge DC/DC module to the output terminal of the low dropout regulator;
  connecting an output terminal of the half-bridge DC/DC module to the internal power terminal of the driver;
  connecting a first internal ground terminal being to the GND node; and
  connecting a second internal ground terminal to the CS node.

13. The method according to claim 11, further comprising:
  configuring a FB node in the controller for electrically connecting to a feedback circuit for sensing a feedback signal $V_{FB}$ which is indicative of an output current flowing through a load;
  implementing a time delay module, connecting an input terminal of the time delay module to the CS node;
  implementing an on-time control module, connecting a first input terminal of the on-time control module to an output terminal of the time delay module, connecting a second input terminal of the on-time control module to the FB node; and
  implementing an isolator, connecting an input terminal of the isolator to an output terminal of the on-time control module;
  connecting an input terminal of the driver to an output terminal of the isolator;
  configuring the time delay module to apply a time delay to the current sensing signal voltage $V_{CS}$;
  configuring the on-time control module to:
    receive the delayed current sensing signal voltage $V_{CS}$ from the time delay module;
    receive the feedback signal $V_{FB}$ from the FB node; and
    generate an on-time control signal $V_{CRTL}$ based on the received feedback signal $V_{FB}$ and the delayed current sensing signal voltage $V_{CS}$; and
  configuring the isolator to couple the on-time control signal $V_{CRTL}$ from the on-time control module to the driver; and
  configuring the driver to:
    receive the on-time control signal $V_{CRTL}$ from the isolator; and
    generate the control driving signal $V_{DRV}$ based on the received on-time control signal $V_{CRTL}$.

14. The method according to claim 13, wherein the implementation of the isolator comprising:
  providing an optical isolator including a light emitting diode and a photo diode;
  connecting a positive terminal of the light emitting diode to the output terminal of the on-time control module, connecting a negative terminal of the light emitting diode to the GND node; and
  connecting a negative terminal of the photo diode to the input terminal of the driver, connecting a positive terminal of the photo diode to the CS node.

15. The method according to claim 13, wherein the implementation of the isolator comprising:
  providing a magnetic isolator including a primary winding and a secondary winding;
  connecting a first terminal of the primary winding to the output terminal of the on-time control module, connecting a second terminal of the primary winding to the GND node; and
  connecting a first terminal of the secondary winding to the input terminal of the driver, connecting a second terminal of the secondary winding to the CS node.

16. The method according to claim 12, further comprising:
  configuring a FB node in the controller for electrically connecting to a feedback circuit for sensing a feedback signal $V_{FB}$ which is indicative of an output current flowing through a load;
  implementing a time delay module, connecting an input terminal of the time delay module to the CS node;
  implementing an on-time control module, connecting a first input terminal of the on-time control module to an output terminal of the time delay module, connecting a second input terminal of the on-time control module to the FB node; and implementing an isolator, connecting an input terminal of the isolator to an output terminal of the on-time control module;

connecting an input terminal of the driver to an output terminal of the isolator;

configuring the time delay module to apply a time delay to the current sensing signal voltage $V_{CS}$;

configuring the on-time control module to:
    receive the delayed current sensing signal voltage $V_{CS}$ from the time delay module;
    receive the feedback signal $V_{FB}$ from the FB node; and
    generate an on-time control signal $V_{CRTL}$ based on the received feedback signal $V_{FB}$ and the delayed current sensing signal voltage $V_{CS}$; and configuring the isolator to couple the on-time control signal $V_{CRTL}$ from the on-time control module to the driver; and configuring the driver to:
    receive the on-time control signal $V_{CRTL}$ from the isolator; and
    generate the control driving signal $V_{DRV}$ based on the received on-time control signal $V_{CRTL}$.

17. The method according to claim 16, wherein the implementation of the isolator comprising:
    providing an optical isolator including a light emitting diode and a photo diode;
    connecting a positive terminal of the light emitting diode to the output terminal of the on-time control module, connecting a negative terminal of the light emitting diode to the GND node; and
    connecting a negative terminal of the photo diode to the input terminal of the driver, connecting a positive terminal of the photo diode to the CS node.

18. The method according to claim 16, wherein the implementation of the isolator comprising:
    providing a magnetic isolator including a primary winding and a secondary winding;
    connecting a first terminal of the primary winding to the output terminal of the on-time control module, connecting a second terminal of the primary winding to the GND node; and
    connecting a first terminal of the secondary winding to the input terminal of the driver, connecting a second terminal of the secondary winding to the CS node.

* * * * *